(12) United States Patent
Xu et al.

(10) Patent No.: US 10,932,031 B2
(45) Date of Patent: Feb. 23, 2021

(54) DISPLAYER

(71) Applicant: BOE TECHNOLOGY GROUP CO., LTD., Beijing (CN)

(72) Inventors: Jian Xu, Beijing (CN); Jianbo Xian, Beijing (CN); Yong Hu, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 393 days.

(21) Appl. No.: 15/762,911

(22) PCT Filed: Aug. 1, 2017

(86) PCT No.: PCT/CN2017/095447
§ 371 (c)(1),
(2) Date: Mar. 23, 2018

(87) PCT Pub. No.: WO2018/054172
PCT Pub. Date: Mar. 29, 2018

(65) Prior Publication Data
US 2020/0260177 A1    Aug. 13, 2020

(30) Foreign Application Priority Data
Sep. 26, 2016   (CN) .......................... 201621082214.9

(51) Int. Cl.
*H04R 1/02* (2006.01)
*H04R 1/28* (2006.01)
*H05K 5/00* (2006.01)
*H05K 5/02* (2006.01)

(52) U.S. Cl.
CPC ........... *H04R 1/2811* (2013.01); *H04R 1/028* (2013.01); *H05K 5/0017* (2013.01); *H05K 5/0217* (2013.01); *H04R 2400/11* (2013.01); *H04R 2499/15* (2013.01)

(58) Field of Classification Search
CPC .. H04R 1/2811; H04R 1/028; H04R 2400/11; H04R 2499/15; H05K 5/0017; H05K 5/0217
USPC ................................................. 381/333, 334
See application file for complete search history.

(56) References Cited

U.S. PATENT DOCUMENTS

2007/0121992 A1   5/2007   Nakagawa
2012/0219173 A1   8/2012   Yukawa

FOREIGN PATENT DOCUMENTS

| CN | 101841751 A | | 9/2010 |
|---|---|---|---|
| CN | 102652436 A | | 8/2012 |
| CN | 103686495 A | * | 3/2014 |
| CN | 103686495 A | | 3/2014 |

(Continued)

OTHER PUBLICATIONS

International Search Report and Written Opinion for Application No. PCT/CN2017/095447, dated Nov. 9, 2017, 10 Pages.

*Primary Examiner* — Ammar T Hamid
(74) *Attorney, Agent, or Firm* — Brooks Kushman P.C.

(57) ABSTRACT

A displayer is provided, including a display module, a speaker and a displayer housing. The speaker includes a fixing support configured to fix the speaker to the displayer and anti-vibration pads, and the displayer housing includes a body and a speaker fixing member on the body. The speaker fixing member includes anti-vibration members configured to restrain a vibration of the speaker, and the anti-vibration members are in contact with the anti-vibration pads.

20 Claims, 5 Drawing Sheets

(56) References Cited

FOREIGN PATENT DOCUMENTS

| | | |
|---|---|---|
| CN | 206058829 U | 3/2017 |
| JP | 2008227709 A | 9/2008 |
| JP | 2011142480 A | 7/2011 |
| JP | 2014161123 A | 9/2014 |
| KR | 20080083897 A | 9/2008 |

* cited by examiner

DISPLAYER

CROSS-REFERENCE TO RELATED APPLICATIONS

This application is the U.S. national phase of PCT Application No. PCT/CN2017/095447 filed on Aug. 1, 2017, which claims priority to Chinese Patent Application No. 201621082214.9 filed on Sep. 26, 2016, which are incorporated herein by reference in their entireties.

TECHNICAL FIELD

The present disclosure relates to the field of a liquid crystal product manufacture, and in particular to a displayer having a speaker anti-vibration member.

BACKGROUND

A back cover of a displayer in the related art is plane or cambered, and a structure for fixing a speaker is a back plate provided with a backlight or a fixing column attached with a bottom border, the speaker may be vibrated in the case of a high volume or a specific audio effect of the displayer. As a result, an abnormal noise may occur or the audio effect may be adversely affected.

SUMMARY

To solve the above technical issue, a displayer is provided by the present disclosure, thereby the audio effect may not be adversely affected in the case that the vibration of the speaker is strong.

To achieve the above objective, a displayer is provided by the present disclosure, including a display module, a speaker and a displayer housing, where the speaker includes a fixing support configured to fix the speaker to the displayer and anti-vibration pads, and the displayer housing includes a body and a speaker fixing member on the body, where the speaker fixing member includes anti-vibration members configured to restrain a vibration of the speaker, and the anti-vibration members are in contact with the anti-vibration pads.

Optionally, the speaker fixing member further includes a first fixing column configured to be matched with the fixing support of the speaker.

Optionally, the display module includes a second fixing column configured to be matched with the fixing support of the speaker.

Optionally, the anti-vibration pads include a top anti-vibration pad, and the anti-vibration members include a first connection portion configured to be in contact with the top anti-vibration pad of the speaker.

Optionally, the first connection portion is a protrusion portion on a baseplate of the body.

Optionally, the protrusion portion is a bar-like member connecting two opposite sides of the body, and the protrusion portion divides the body into a first region and a second region provided with the speaker fixing member.

Optionally, the first region is sunken towards an inner side of the displayer, to form a step-like portion between the first region and the second region.

Optionally, the anti-vibration pads include a lateral anti-vibration pad, and the anti-vibration members include a second connection portion configured to be in contact with the lateral anti-vibration pad of the speaker.

Optionally, the second connection portion is a protrusion portion on the baseplate of the body.

Optionally, the first connection portion is the protrusion portion on the baseplate of the body and the second connection portion is a protrusion portion on the baseplate of the body, and the first connection portion and the second connection portion together form a frame member having an opening and surrounding the speaker.

Optionally, a sound outlet hole is at a bottom of the body and arranged at a position corresponding to a position of the speaker.

Optionally, the body includes the baseplate, a first side border, a second side border, a third side border and a fourth side border, the second side border is opposite to the third side border, and the first side border is opposite to the fourth side border; the first connection portion extends from the second side border to the third side border, and the first connection portion divides the body into a first region and a second region provided with the speaker fixing member.

Optionally, the first connection portion is connected to the second connection portion adjacent to the first connection portion, to form the frame member surrounding the speaker.

Optionally, the first connection portion is separated apart from the second connection portion adjacent to the first connection portion, and the first connection portion and the second connection portion adjacent to the first connection portion together form the frame member surrounding the speaker.

Optionally, the sound outlet hole is at a fourth side border of the body, and the sound outlet hole is opposite to a sound outlet hole of the speaker.

According to the present disclosure, due to the anti-vibration members, the audio effect may not be adversely affected in the case that the vibration of the speaker is strong.

DETAILED DESCRIPTION OF THE EMBODIMENTS

Figure 1:
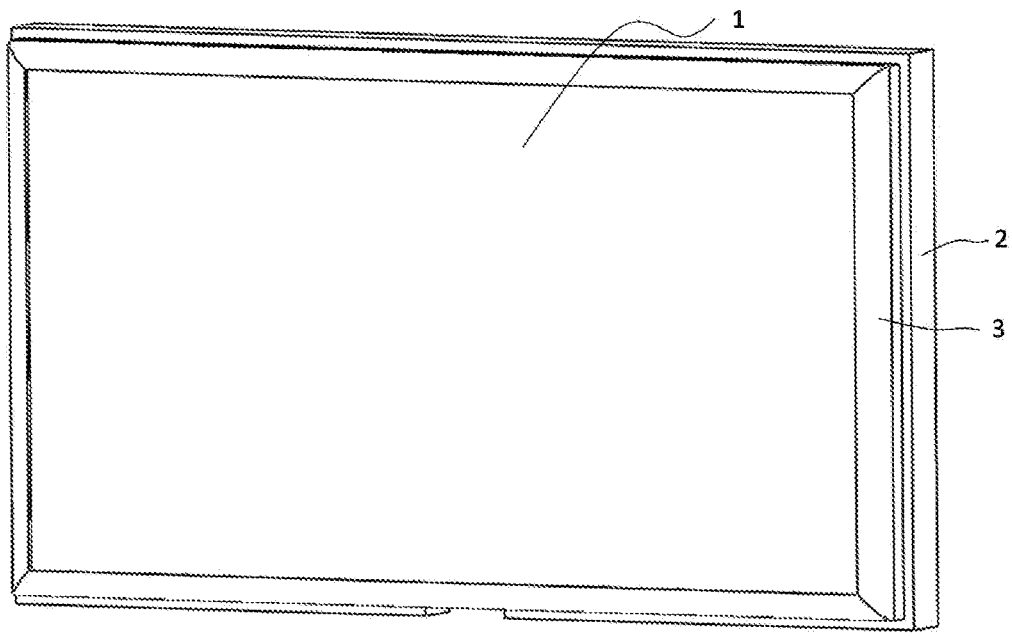
FIG. 1 is a schematic view of a displayer in at least one embodiment of the present disclosure.
Figure 2:
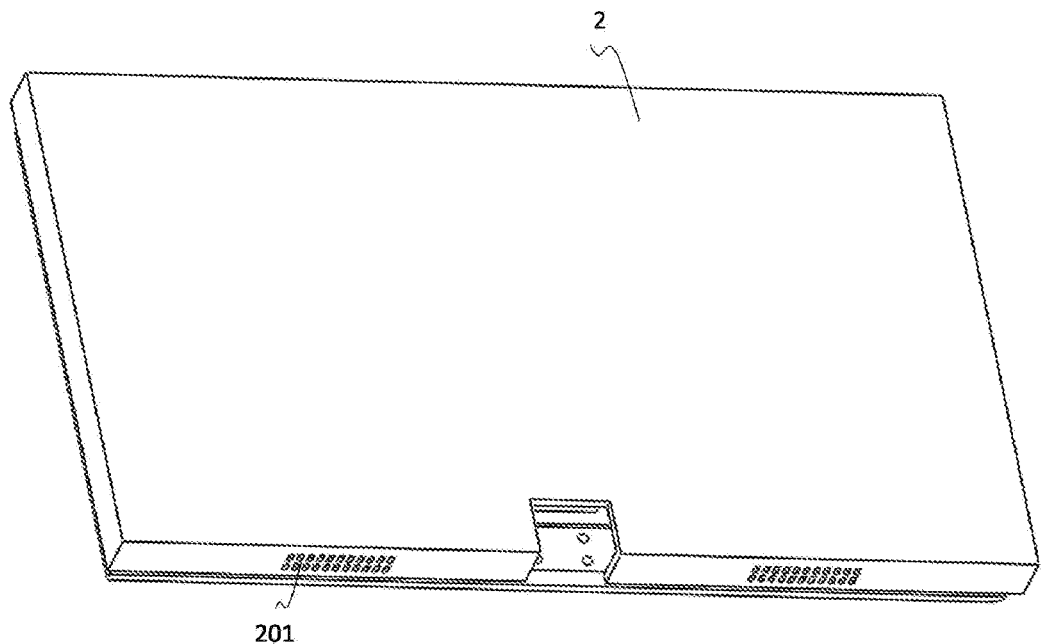
FIG. 2 is a schematic view showing a back of a displayer in at least one embodiment of the present disclosure.

The present disclosure will be described hereinafter in conjunction with the drawings. The following embodiments are for illustrative purposes only, but shall not be used to limit the scope of the present disclosure.

As shown in FIGS. 1 to 5, a displayer is provided in at least one embodiment of the present disclosure, including a display module 1, a displayer housing, a displayer front cover 3 and a speaker 4. The speaker 4 includes a fixing support 401 configured to fix the speaker 4 to the displayer and anti-vibration pads 405, and the displayer housing includes a body 2 and a speaker fixing member on the body 2. The speaker fixing member includes anti-vibration members configured to restrain a vibration of the speaker, and the anti-vibration members are in contact with the anti-vibration pads.

Due to the anti-vibration members, the audio effect may not be adversely affected in the case that the vibration of the speaker 4 is strong, and the anti-vibration members are in contact with the anti-vibration pads of the speaker 4, thereby further restraining the vibration of the speaker 4.

In at least one embodiment of the present disclosure, the display module includes a second fixing column 102 configured to be matched with the fixing support 401 of the speaker 4.

Figure 3:
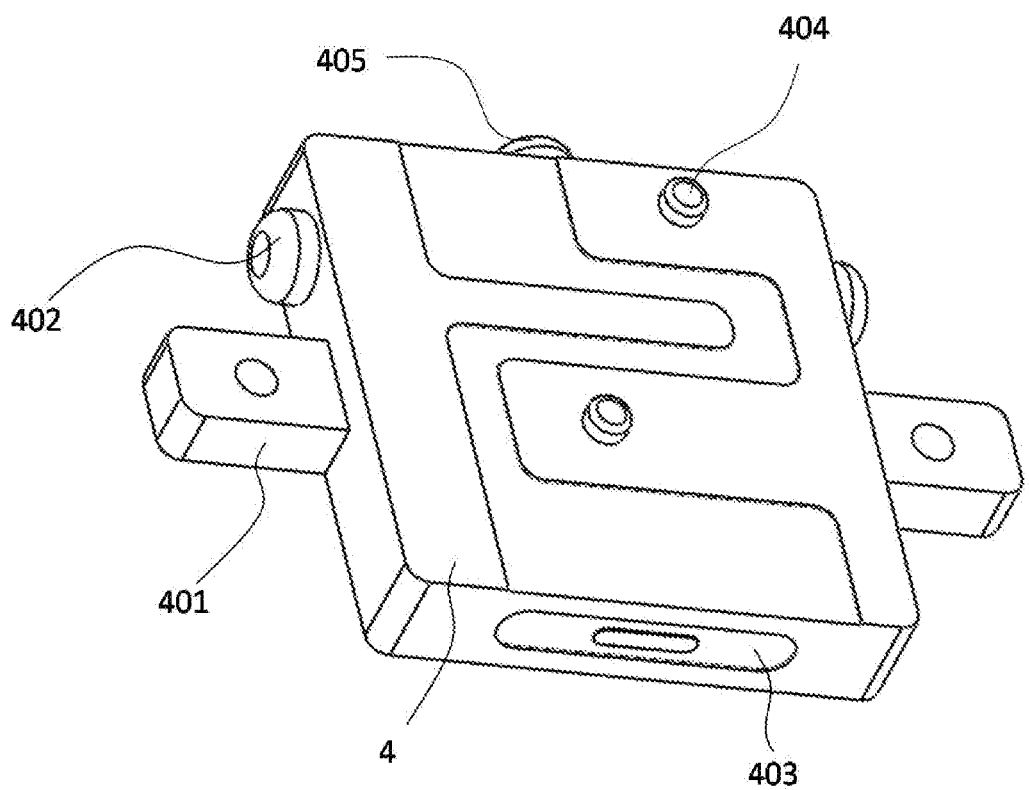
FIG. 3 is a schematic view of a speaker in at least one embodiment of the present disclosure.
Figure 4:
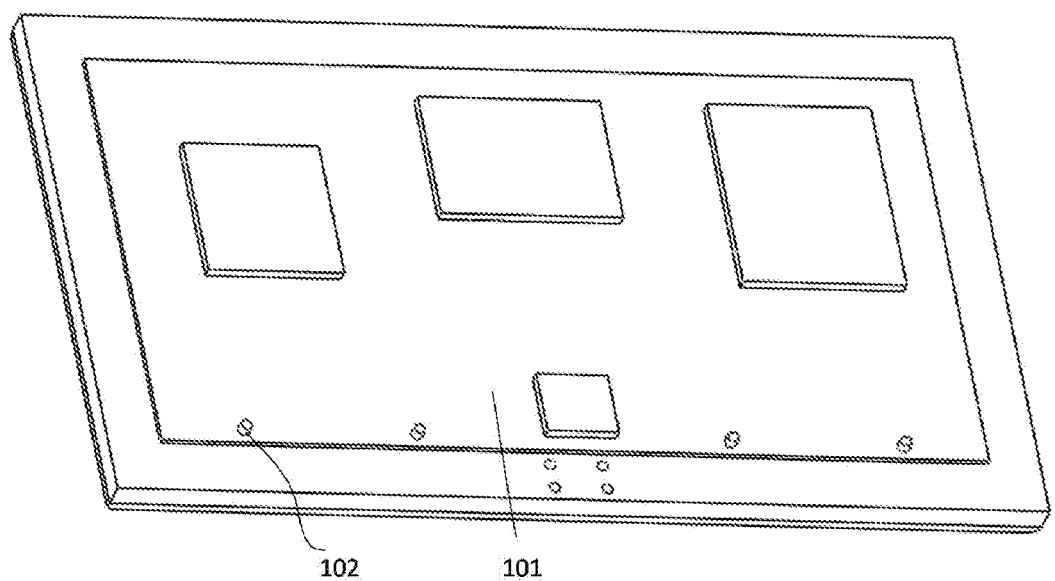
FIG. 4 is a schematic view showing a back of a display module of a displayer in at least one embodiment of the present disclosure.
Figure 5:
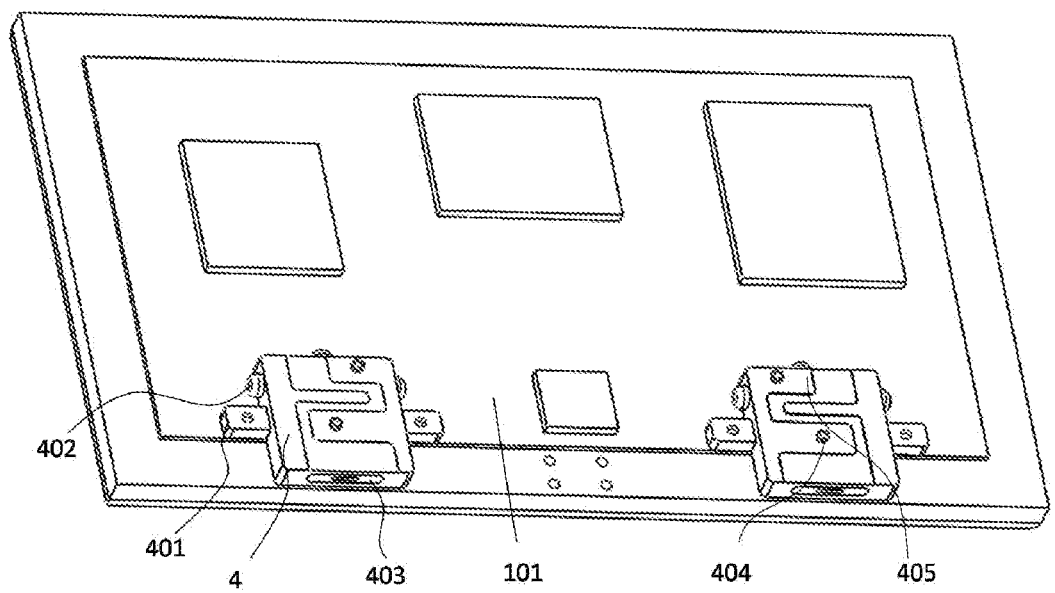
FIG. 5 is a schematic view showing a display module of a displayer and a speaker which are assembled to each other in at least one embodiment of the present disclosure.

In at least one embodiment of the present disclosure, as shown in FIG. 3 to FIG. 5, the anti-vibration pads include a lateral anti-vibration pad 402 at a lateral surface of the speaker 4, a top anti-vibration pad 405 at a top of the speaker 4 (the top of the speaker 4 is also the top of the displayer) and an horizontal anti-vibration pad 404 on a first surface of the speaker 4. After the displayer housing is assembled to the speaker 4, the first surface of the speaker 4 is opposite to a baseplate 20 of the body of the displayer housing.

A second sound outlet hole 403 is at a bottom of the speaker 4 (opposite to the top of the speaker 4). As shown in FIG. 4, in at least one embodiment of the present disclosure, a first sound outlet hole 201 is at a bottom of the body 2 and arranged at a position corresponding to a position of the speaker 4. After the speaker 4 is assembled to the display housing, a position of the second sound outlet hole 403 corresponds to the position of the first sound outlet hole 201. The anti-vibration members are in contact with the top anti-vibration pad 405 and/or the lateral anti-vibration pad 402, so as to restrain the vibration of the speaker.

As shown in FIG. 6 to FIG. 10, the structure of the anti-vibration members may be varied, as long as the vibration of the speaker 4 may be restrained. In at least one embodiment of the present disclosure, the anti-vibration members include a first connection portion 203 configured to be in contact with the top anti-vibration pad 405 of the speaker 4.

Optionally, the first connection portion 203 is a protrusion portion on a baseplate 20 of the body 2.

The first connection portion 203 is at the top of the speaker 4 and in contact with the top anti-vibration pad 405, thereby restraining the vibration of the speaker 4 and preventing dust. In addition, as the first connection portion 203 is the protrusion portion on the baseplate 20 of the body 2, the first connection portion 203 may be made of a material identical to the displayer housing and formed together with the displayer housing, therefore the manufacture thereof is simple and the cost thereof is low.

The first connection portion 203 may have various shapes, as long as the first connection portion 203 may be in contact with the top anti-vibration pad 405 to prevent the speaker 4 from being vibrated strongly. In at least one embodiment of the present disclosure, the first connection portion 203 is a bar-like member connecting two opposite side borders of the body 2, and the first connection portion 203 divides the body 2 into a first region and a second region provided with the speaker fixing member.

Figure 6:
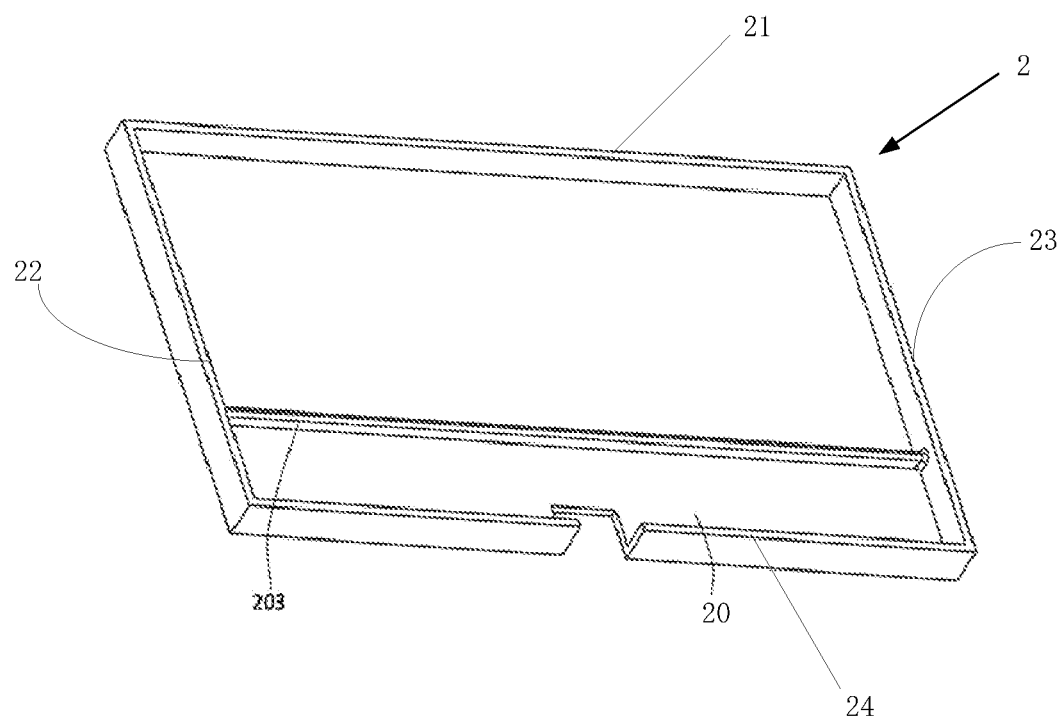
FIG. 6 is a schematic view of a displayer housing in at least one embodiment of the present disclosure.
Figure 7:
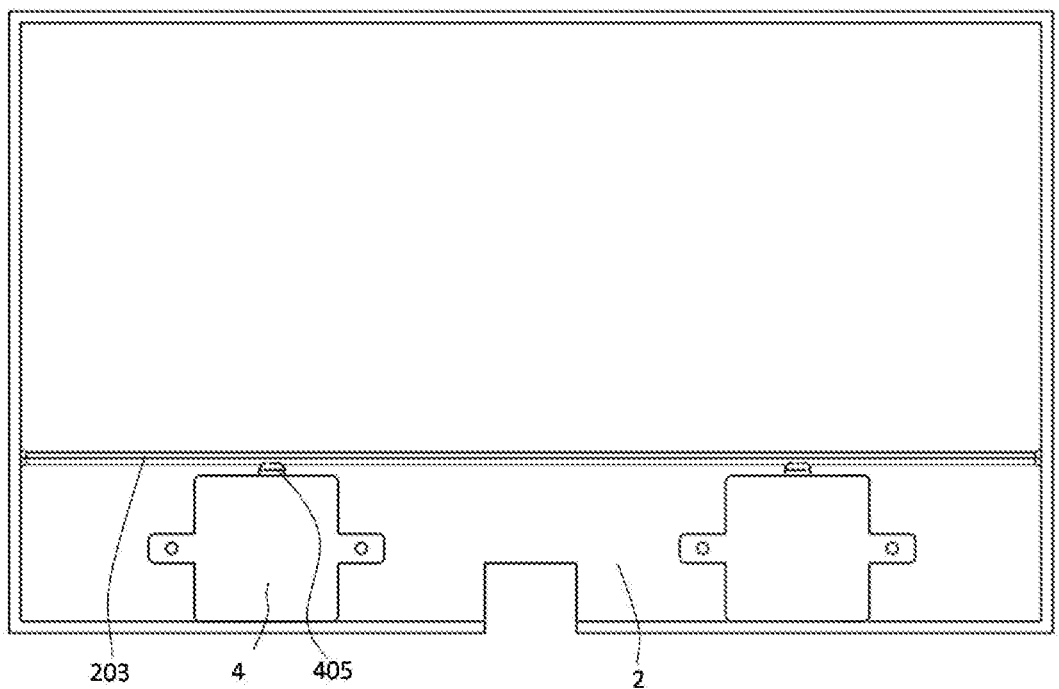
FIG. 7 is a schematic view showing a back of a displayer housing in at least one embodiment of the present disclosure.
Figure 8:
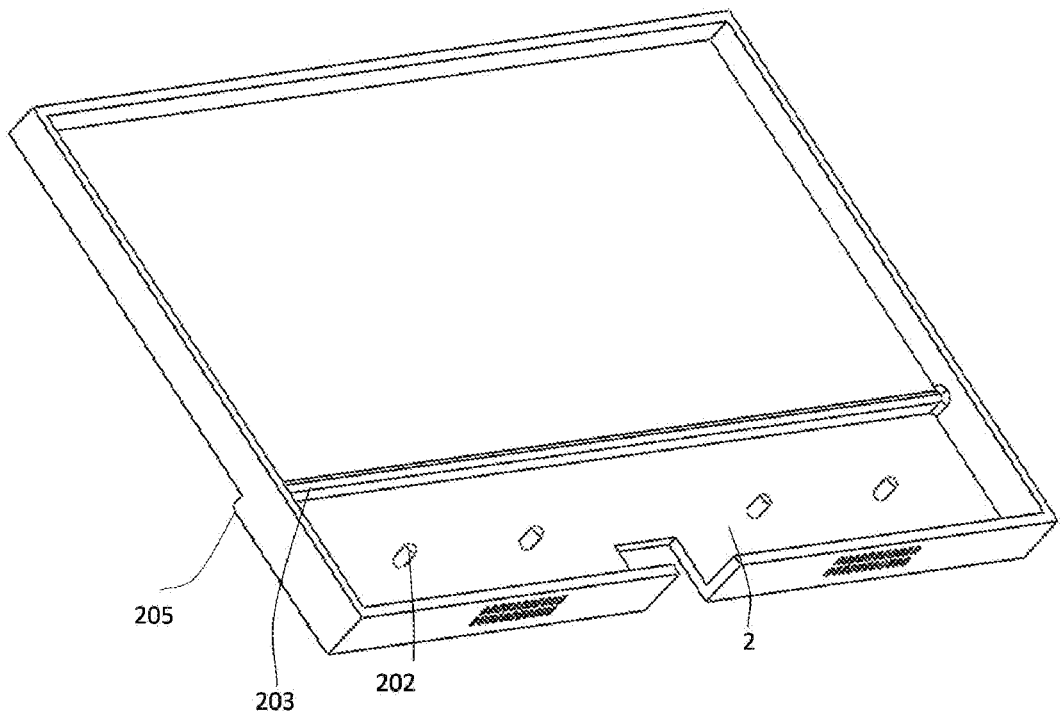
FIG. 8 is a schematic view of a displayer housing in at least one embodiment of the present disclosure.
Figure 9:
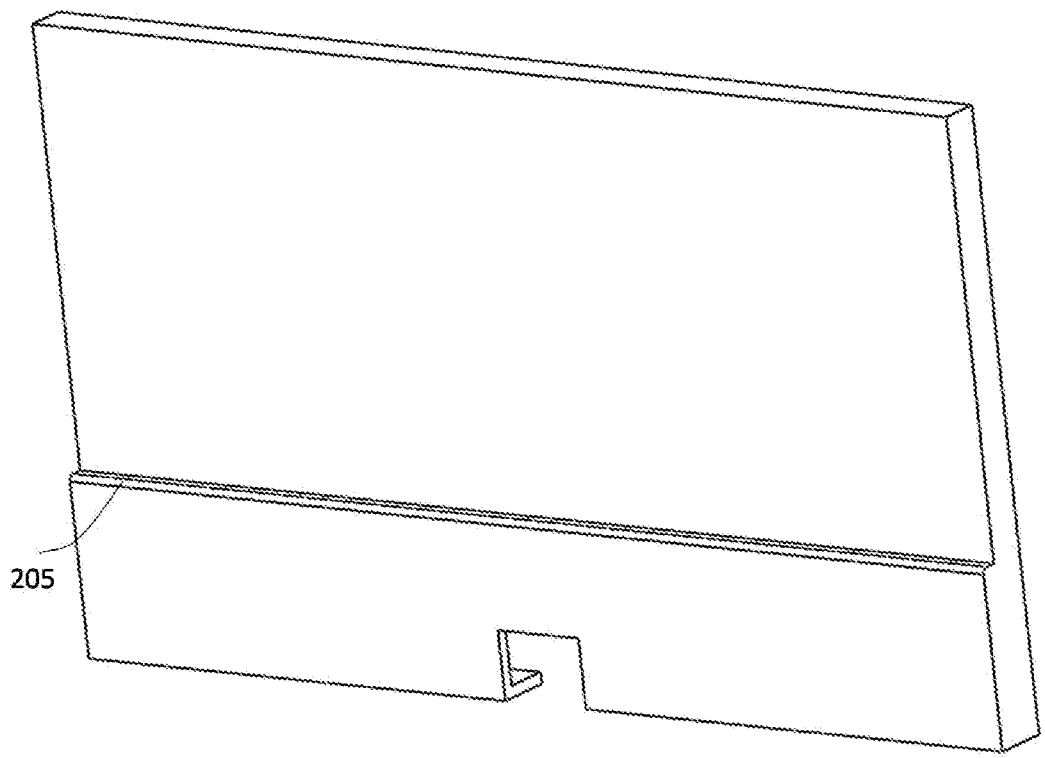
FIG. 9 is a schematic view showing a back of a displayer housing in at least one embodiment of the present disclosure.

As shown in FIG. 6, the body 2 includes the baseplate 20, a first side border 21, a second side border 22, a third side border 23 and a fourth side border 24, the second side border 22 is opposite to the third side border 23, and the first side border 21 is opposite to the fourth side border 24. The first connection portion 203 is the protrusion portion on the body 2 and in contact with the top anti-vibration pad 405. The first connection portion 203 extends from the second side border 22 to the third side border 23 opposite to the second side border 22 of the body 2. After the speaker 4 is assembled to the display housing, the first connection portion 203 covers the top of the speaker 4. In other words, the position of the speaker 4 is limited at the second region. Therefore, the first connection portion 203 may restrain the vibration of the speaker 4 and prevent dust. As shown in FIG. 7 to FIG. 9, in at least one embodiment of the present disclosure, the first region is sunken towards an inner side of the displayer so as to form a step-like portion 205 between the first region and the second region. The speaker fixing member further includes a first fixing column 202 configured to be matched with the fixing support 401 to fix the speaker 4. The first fixing column 202 for fixing the speaker 4 is at the second region, and the second region is at a position corresponding to the back plate 101 of the display module. The step-like portion 205 increase a load bearing strength of the bottom portion of the displayer and makes a certain part of the displayer thinner.

In at least one embodiment of the present disclosure, the anti-vibration pads include a lateral anti-vibration pad, and the anti-vibration members includes a second connection portion 204 in contact with the lateral anti-vibration pad of the speaker 4.

Optionally, the second connection portion 204 is a protrusion portion on the baseplate 20 of the body 2.

Figure 10:
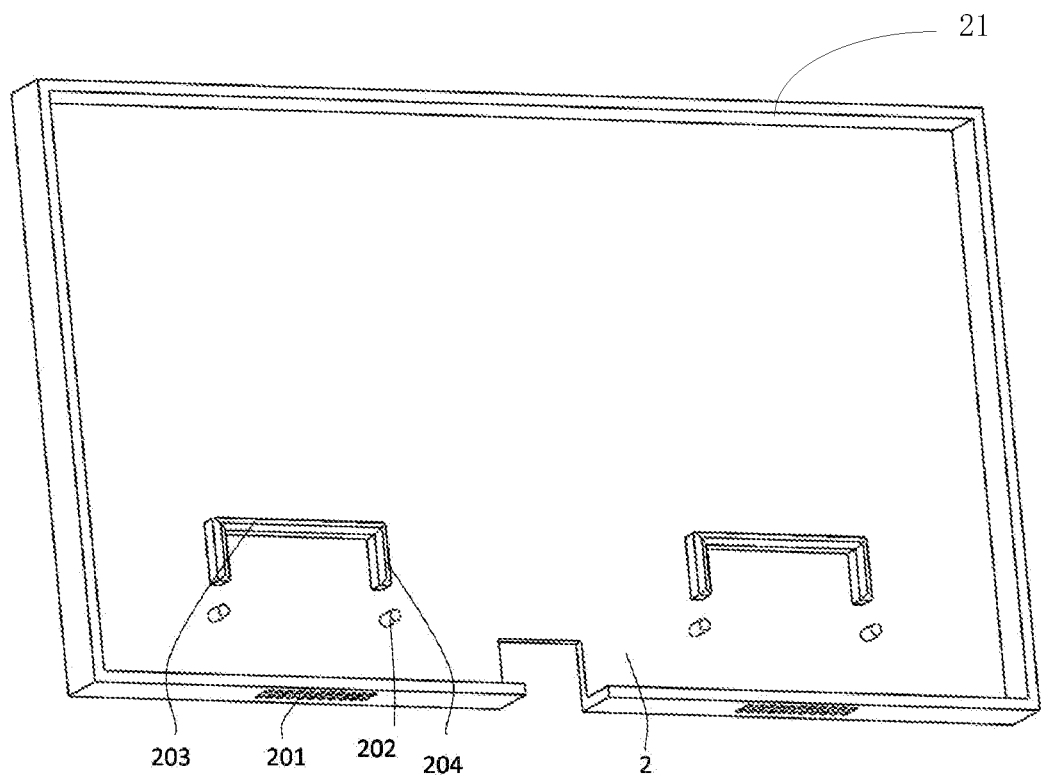
FIG. 10 is a schematic view of a displayer housing in at least one embodiment of the present disclosure.

As shown in FIG. 10, the first connection portion 203 may be merely arranged at a position corresponding to the top anti-vibration pad 405. That is, the first connection portion 203 does not extend from the second side border 22 to the third side border 23 opposite to the second side border 22 of the body 2, but include sub protrusion portions separated apart from each other and each has a length identical to the length of the speaker 4 along a direction parallel to the first side border 21 of the body 2, and the number of the sub protrusion portions is the same as the number of the speakers 4.

In at least one embodiment of the present disclosure, the first connection portion 203 is the protrusion portion on the baseplate 20 of the body 2 and the second connection portion 204 is the protrusion portion on the baseplate 20 of the body 2, and the first connection portion 203 is connected to the second connection portion 204 to form a frame member having an opening and surrounding the speaker 4. As shown in FIG. 10, the first connection portion 203 is connected to the second connection portion 204 adjacent to the first connection portion 203, so as to form the frame member surrounding the speaker 4.

The first connection portion 203 is in contact with the top anti-vibration pad 405, and the second connection portion 204 is in contact with the lateral anti-vibration pad. The first connection portion 203 is connected to the second connection portion 204, and the speaker 4 is accommodated in the frame member formed by the first connection portion 203 and the second connection portion 204.

Optionally, the first connection portion 203 may not be connected to the second connection portion 204, that is, the first connection portion 203 is separated apart from the second connection portion 204 adjacent thereto, as long as the first connection portion 203 may be in contact with the top anti-vibration pad 405 and the second connection portion 204 may be in contact with the lateral anti-vibration pad. The first connection portion 203, together with the second connection portion 204, may further restrain the vibration of the speaker 4 and guarantee the audio effect of the speaker 4.

In at least one embodiment of the present disclosure, as shown in FIG. 10, the first sound outlet hole 201 is at the fourth side border 24 of the body 2, and the first sound outlet hole 201 is opposite to a second sound outlet hole 403 of the speaker 4.

The above are merely the preferred embodiments of the present disclosure. A person skilled in the art may make further modifications and improvements without departing from the principle of the present disclosure, and these modifications and improvements shall also fall within the scope of the present disclosure.

What is claimed is:

1. A displayer, comprising a display module, a speaker and a displayer housing, wherein the speaker comprises a fixing support configured to fix the speaker to the displayer and anti-vibration pads, and the displayer housing comprises a body and a speaker fixing member on the body, wherein the speaker fixing member comprises anti-vibration members configured to restrain a vibration of the speaker, and the anti-vibration members are in contact with the anti-vibration pads;
   wherein the speaker fixing member further comprises a first fixing column configured to be matched with the fixing support of the speaker;
   wherein the anti-vibration pads comprise a top anti-vibration pad, and the anti-vibration members comprise a first connection portion configured to be in contact with the top anti-vibration pad of the speaker;
   wherein the first connection portion is a first protrusion portion on a baseplate of the body;
   wherein the protrusion portion is a bar-like member connecting two opposite sides of the body, and the protrusion portion divides the body into a first region and a second region provided with the speaker fixing member.

2. The displayer according to claim 1, wherein the display module comprises a second fixing column configured to be matched with the fixing support of the speaker.

3. The displayer according to claim 1, wherein the first region is sunken towards an inner side of the displayer, to form a step-like portion between the first region and the second region.

4. The displayer according to claim 1, wherein the anti-vibration pads comprise a lateral anti-vibration pad, and the anti-vibration members comprise a second connection portion configured to be in contact with the lateral anti-vibration pad of the speaker.

5. The displayer according to claim 4, wherein the second connection portion is a second protrusion portion on the baseplate of the body.

6. The displayer according to claim 4, wherein the second connection portion is a second protrusion portion on the baseplate of the body, and the first connection portion and the second connection portion together form a frame member having an opening and surrounding the speaker.

7. The displayer according to claim 1, wherein a sound outlet hole is at a bottom of the body and arranged at a position corresponding to a position of the speaker.

8. The displayer according to claim 1, wherein the body comprises the baseplate, a first side border, a second side border, a third side border and a fourth side border, the second side border is opposite to the third side border, and the first side border is opposite to the fourth side border;
   the first connection portion extends from the second side border to the third side border, and the first connection portion divides the body into a first region and a second region provided with the speaker fixing member.

9. The displayer according to claim 6, wherein the first connection portion is connected to the second connection portion adjacent to the first connection portion, to form the frame member surrounding the speaker.

10. The displayer according to claim 6, wherein the first connection portion is separated apart from the second connection portion adjacent to the first connection portion, and the first connection portion and the second connection portion adjacent to the first connection portion together form the frame member surrounding the speaker.

11. The displayer according to claim 7, wherein the sound outlet hole is at a fourth side border of the body, and the sound outlet hole is opposite to a sound outlet hole of the speaker.

12. The displayer according to claim 2, wherein the anti-vibration pads comprise a top anti-vibration pad, and the anti-vibration members comprise a first connection portion configured to be in contact with the top anti-vibration pad of the speaker.

13. A displayer, comprising a display module, a speaker and a displayer housing, wherein the speaker comprises a fixing support configured to fix the speaker to the displayer and anti-vibration pads, and the displayer housing comprises a body and a speaker fixing member on the body, wherein the speaker fixing member comprises anti-vibration members configured to restrain a vibration of the speaker, and the anti-vibration members are in contact with the anti-vibration pads;
   wherein the speaker fixing member further comprises a first fixing column configured to be matched with the fixing support of the speaker;
   wherein the anti-vibration pads comprise a top anti-vibration pad, and the anti-vibration members comprise a first connection portion configured to be in contact with the top anti-vibration pad of the speaker;
   wherein the first connection portion is a first protrusion portion on a baseplate of the body; and
   wherein the anti-vibration pads comprise a lateral anti-vibration pad, and the anti-vibration members comprise a second connection portion configured to be in contact with the lateral anti-vibration pad of the speaker.

14. The displayer according to claim 13, wherein the display module comprises a second fixing column configured to be matched with the fixing support of the speaker.

15. The displayer according to claim 13, wherein the first region is sunken towards an inner side of the displayer, to form a step-like portion between the first region and the second region.

16. The displayer according to claim 13, wherein the second connection portion is a second protrusion portion on the baseplate of the body.

17. A displayer, comprising a display module, a speaker and a displayer housing, wherein the speaker comprises a fixing support configured to fix the speaker to the displayer and anti-vibration pads, and the displayer housing comprises a body and a speaker fixing member on the body, wherein the speaker fixing member comprises anti-vibration members configured to restrain a vibration of the speaker, and the anti-vibration members are in contact with the anti-vibration pads;

wherein the speaker fixing member further comprises a first fixing column configured to be matched with the fixing support of the speaker;

wherein the anti-vibration pads comprise a top anti-vibration pad, and the anti-vibration members comprise a first connection portion configured to be in contact with the top anti-vibration pad of the speaker; and wherein a sound outlet hole is at a bottom of the body and arranged at a position corresponding to a position of the speaker.

18. The displayer according to claim 17, wherein the display module comprises a second fixing column configured to be matched with the fixing support of the speaker.

19. The displayer according to claim 18, wherein the anti-vibration pads comprise a top anti-vibration pad, and the anti-vibration members comprise a first connection portion configured to be in contact with the top anti-vibration pad of the speaker.

20. The displayer according to claim 17, wherein the sound outlet hole is at a fourth side border of the body, and the sound outlet hole is opposite to a sound outlet hole of the speaker.

* * * * *